(12) United States Patent
Hwang

(10) Patent No.: US 11,575,366 B2
(45) Date of Patent: Feb. 7, 2023

(54) LOW POWER FLIP-FLOP

(71) Applicant: SAMSUNG ELECTRONICS CO., LTD., Suwon-si (KR)

(72) Inventor: Hyunchul Hwang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/583,257

(22) Filed: Jan. 25, 2022

(65) Prior Publication Data

US 2022/0247388 A1 Aug. 4, 2022

(30) Foreign Application Priority Data

Feb. 3, 2021 (KR) .......................... 10-2021-0015652

(51) Int. Cl.
| | |
|---|---|
| *H03K 3/037* | (2006.01) |
| *H03K 3/356* | (2006.01) |
| *H03K 3/012* | (2006.01) |
| *G01R 31/3185* | (2006.01) |
| *G01R 31/317* | (2006.01) |
| *H03K 19/20* | (2006.01) |

(52) U.S. Cl.
CPC ....... *H03K 3/037* (2013.01); *G01R 31/31727* (2013.01); *G01R 31/318533* (2013.01); *H03K 3/012* (2013.01); *H03K 3/356104* (2013.01); *H03K 19/20* (2013.01)

(58) Field of Classification Search
CPC ...... H03K 3/012; H03K 3/037; H03K 3/0372; H03K 3/356104; H03K 3/3562; H03K 3/35625
See application file for complete search history.

(56) References Cited

U.S. PATENT DOCUMENTS

| | | |
|---|---|---|
| 8,072,252 B2 | 12/2011 | Bailey |
| 8,604,855 B2 | 12/2013 | Dally et al. |

(Continued)

FOREIGN PATENT DOCUMENTS

EP 1940027 B1 11/2014

OTHER PUBLICATIONS

Natsumi Kawai, A Fully Static Topologically-Compressed 21-Transistor Flip-Flop With 75% Power Saving, 2013 IEEE Asian Solid-State Circuits Conference (A-SSCC), 117-120, Kawasaki City, Japan.

*Primary Examiner* — Patrick O Neill
(74) *Attorney, Agent, or Firm* — Volentine, Whitt & Francos, PLLC

(57) ABSTRACT

A low power flip-flop includes first to fourth signal generation circuits and an inverter. The first signal generation circuit receives the clock signal, the data input signal, and a first internal signal that is an output of the second signal generation circuit and generates a second internal signal. The inverter receives the first internal signal and generates an inverted first internal signal. The second signal generation circuit receives the first internal signal and the output signal that is an output of the third signal generation circuit, and generates the inverted output signal. The third signal generation circuit receives the clock signal and the inverted output signal and generates the output signal. The fourth signal generation circuit receives the inverted first internal signal, the second internal signal, and the clock signal and generates the first internal signal.

20 Claims, 15 Drawing Sheets

(56) References Cited

U.S. PATENT DOCUMENTS

| | | |
|---|---|---|
| 8,947,146 B2 | 2/2015 | Lee et al. |
| 9,035,686 B1 | 5/2015 | Hsu et al. |
| 9,065,431 B2 | 6/2015 | Kim et al. |
| 9,397,641 B2 | 7/2016 | Hsu et al. |
| 9,641,160 B2 | 5/2017 | Agarwal et al. |
| 9,960,753 B2 | 5/2018 | Hsu et al. |
| 10,270,430 B2 | 4/2019 | Gou et al. |
| 10,326,430 B2* | 6/2019 | Lai .................. H03K 3/356104 |
| 10,911,032 B2* | 2/2021 | Hwang .............. H03K 3/35625 |
| 11,005,459 B1* | 5/2021 | Hess .................... G11C 19/184 |
| 11,025,236 B1* | 6/2021 | Lai ....................... H03K 3/3562 |
| 2019/0296719 A1 | 9/2019 | Lai et al. |
| 2021/0270899 A1* | 9/2021 | Choi ................ H03K 3/356121 |

\* cited by examiner

LOW POWER FLIP-FLOP

CROSS-REFERENCE TO RELATED APPLICATION

This application claims priority under 35 U.S.C. § 119 to Korean Patent Application No. 10-2021-015652 filed on Feb. 3, 2021 in the Korean Intellectual Property Office, the subject matter of which is hereby incorporated by reference.

BACKGROUND

The inventive concept relates generally to a class of electronic circuits commonly known as "flip-flops." More particularly, the inventive concept relates to low-power flip-flops.

A flip-flop is an electronic circuit with two stable state that can be used to store binary data. The value of the stored data may be changed by varying input signal(s) applied to the flip-flop. Flip-flops are fundamental building blocks of many digital electronic systems used in computers, communications and many other systems. There are different types of flip-flops that may be variously implemented.

Mobile devices such as smartphones and tablet personal computers (PCs) require low-power designs. Because many processors used in mobile devices include numerous flip-flops, the provision of more power-efficient flip-flops may greatly reduce overall power consumption of mobile devices.

Certain flip-flops may consume power in relation to a logic-level transition of a clock signal, even when no change in logic state occurs in the flip-flop. This characteristic may disproportionately affect power consumption in a mobile device having relatively low switching activity. Accordingly, a flip-flop having reduced power consumption is required, particularly in applications of performance states characterized by relatively low change in data.

SUMMARY

Embodiments of the inventive concept provide a low power flip-flop capable of minimizing power consumption by preventing the charge or discharge of an internal node of the flip-flop from in relation to transitions of a clock signal, when no change in data occurs.

According to an aspect of the inventive concept, there is provided a flip-flop that receives a data input signal and generates an output signal and an inverted output signal in response to a clock signal. The flip-flop includes; a first signal generation circuit, a second signal generation circuit, a third signal generation circuit, a fourth signal generation circuit, and an inverter, wherein the first signal generation circuit receives the clock signal, the data input signal, and a first internal signal, and generates a second internal signal, the inverter receives the first internal signal and generates an inverted first internal signal, the second signal generation circuit receives the first internal signal and an output signal from the third signal generation circuit and generates the inverted output signal, the third signal generation circuit receives the clock signal and the inverted output signal and generates the output signal from the third signal generation circuit, and the fourth signal generation circuit receives the inverted first internal signal, the second internal signal, and the clock signal and generates the first internal signal.

According to an aspect of the inventive concept, there is provided a flip-flop that receives a data input signal and generates an output signal and an inverted output signal in response to a clock signal. The flip-flop includes; a first signal generation circuit, a second signal generation circuit, a third signal generation circuit, a fourth signal generation circuit, and an inverter, wherein the first signal generation circuit receives an output signal from the third signal generation circuit, the clock signal, the data input signal, and a first internal signal, and generates a second internal signal, the inverter receives the first internal signal and generates an inverted first internal signal, the second signal generation circuit receives the second internal signal, the clock signal, the inverted first internal signal, and an inverted output signal and generates the first internal signal, the third signal generation circuit receives the inverted first internal signal, the clock signal, the second internal signal, and the inverted output signal and generates the output signal from the third signal generation circuit, and the fourth signal generation circuit receives the output signal, the first internal signal, the clock signal, and the data input signal and generates the inverted output signal.

According to an aspect of the inventive concept, there is provided a flip-flop that receives a data input signal and generates a high output signal and a low inverted output signal in response to a clock signal and a set signal. The flip-flop includes; a first signal generation circuit, a second signal generation circuit, a third signal generation circuit, and a fourth signal generation circuit, an OR gate that receives the set signal and a first internal signal and generates a third internal signal, and an inverter that receives the third internal signal and generates an inverted third internal signal, wherein the first signal generation circuit receives a set signal, an output signal from the third signal generation circuit, the clock signal, the data input signal, and a first internal signal, and generates a second internal signal, the inverter receives the first internal signal and generates an inverted first internal signal, the second signal generation circuit receives the second internal signal, the clock signal, the inverted third internal signal, and an inverted output signal and generates the first internal signal, the third signal generation circuit receives the inverted third internal signal, the clock signal, the second internal signal, and the inverted output signal and generates the output signal from the third signal generation circuit, and the fourth signal generation circuit receives the set signal and the output signal, the first internal signal, the clock signal, and the data input signal and generates the inverted output signal.

According to an aspect of the inventive concept, there is provided a flip-flop that receives a data input signal and generates an output signal and an inverted output signal in response to a clock signal. The flip-flop includes; a first signal generation circuit, a second signal generation circuit, a third signal generation circuit, a fourth signal generation circuit and an inverter, wherein the first signal generation circuit receives the clock signal, a first internal signal and the data input signal and generates a second internal signal, the inverter receives the first internal signal and generates an inverted first internal signal, the second signal generation circuit receives the second internal signal, the clock signal, and the inverted first internal signal and generates the first internal signal, the third signal generation circuit receives the clock signal, the second internal signal, and an inverted output signal and generates the output signal, and the fourth signal generation circuit receives the output signal, the first internal signal, and the clock signal and generates the inverted output signal.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in some additional detail with reference to the accompanying drawings. Throughout the written description and drawings, like reference numbers and labels are used to denote like elements, components or features.

In one comparative example, a flip-flop may be implemented as a transmission-gate flip-flop (TGFF). The TGFF includes a transmission gate receiving the clock signal CK and an inverted clock signal having a phase that is the opposite of the phase of the clock signal CK. Because the TGFF uses both the clock signal CK and the inverted clock signal, the TGFF may be referred to as a two-phase clock type of flip-flop. Here, the TGFF may receive the clock signal CK through two inverters that continuously consumes power in relation to transitions of the clock signal CK, even when there is no transition of the data input signal D.

In another comparative example, a flip-flop may be implemented as a true single phase clocking (TSPC) flip-flop. Here, the TSPC flip-flop does not use the inverted clock signal like the TGFF. However, a transistor within the TSPC flip-flop continuously charges and discharges in response to transitions of the clock signal CK, thereby consuming power even when the level of the data input signal D remains fixed.

Figure 1:
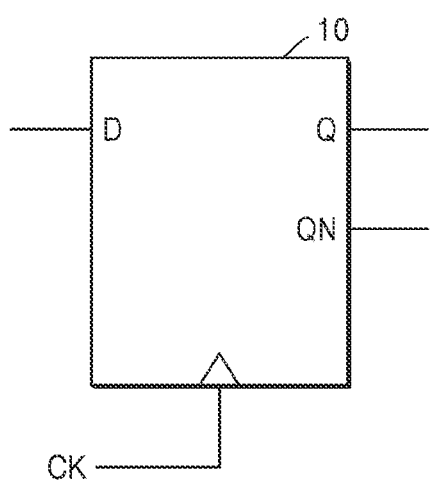
FIG. 1 is a block diagram illustrating a data flip-flop according to embodiments of the inventive concept.

FIG. 1 is a block diagram illustrating a data flip-flop 10 according to embodiments of the inventive concept.

Referring to FIG. 1, the data flip-flop 10 may receive a data input signal D and may output an output signal Q or an inverted output signal QN by latching the data input signal D in response to a clock signal CK. However, the data flip-flop 10 operates with markedly reduced power consumption when the data input signal D remains fixed (e.g.,) by maintaining an internal signal to be at a fixed level. This type of low-power, data flip-flop exhibits greatly reduced power consumption relative to the comparative examples of conventionally implemented TGFF and TSPC. Accordingly, a processor including flip-flops, like the flip-flop 10 of FIG. 1, operate with greatly reduced power consumption and are particularly well-suited for operation in mobile devices.

Figure 2:
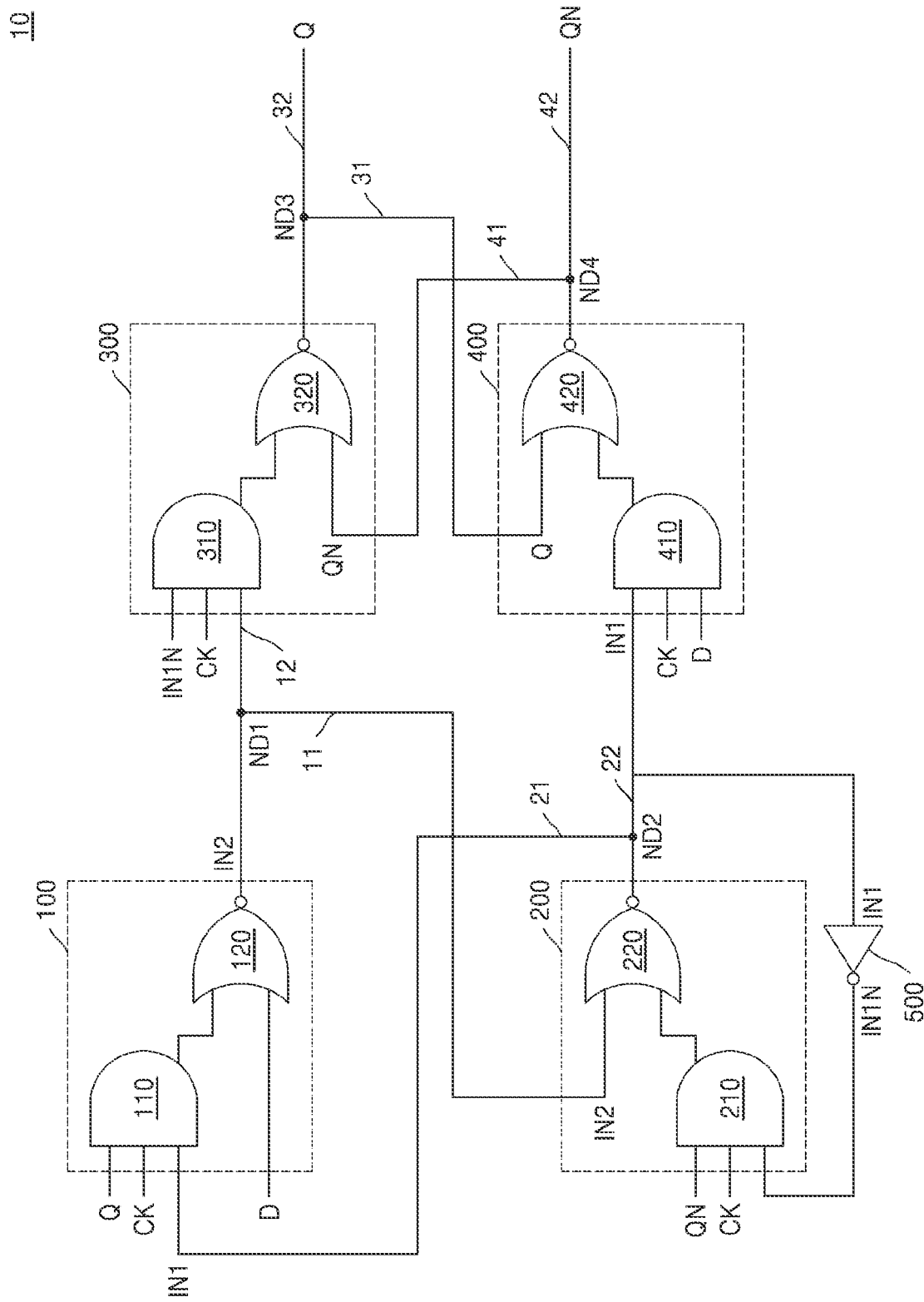
FIGS. 2, 5, 6, 7 and 9 are respective logic diagrams further illustrating the data flip-flop of FIG. 1 according to embodiments of the inventive concept.

FIG. 2 is a logic diagram further illustrating in one example the data flip-flop 10 of FIGS. 1.

Referring to FIG. 2, the data flip-flop 10 may include a first signal generation circuit 100, a second signal generation circuit 200, a third signal generation circuit 300, a fourth signal generation circuit 400, and an inverter 500.

The first signal generation circuit 100 may be respectively connected to the second signal generation circuit 200 and the third signal generation circuit 300 through signal lines 11 and 12 diverging from a first data node ND1. In this manner, the second signal generation circuit 200 and the third signal generation circuit 300 may receive an output value from the first signal generation circuit 100.

The second signal generation circuit 200 may be respectively connected to the first signal generation circuit 100 and the fourth signal generation circuit 400 through signal lines 21 and 22 diverging from a second data node ND2. In this manner, the first signal generation circuit 100 and the fourth signal generation circuit 400 may receive an output value from the second signal generation circuit 200.

The third signal generation circuit 300 may be connected to the fourth signal generation circuit 400 through a signal line 31 extending from a third data node ND3. In this manner, the fourth signal generation circuit 400 may receive an output value from the third signal generation circuit 300.

The fourth signal generation circuit 400 may be connected to the third signal generation circuit 300 through a signal line 41 extending from a fourth data node ND4. In this manner, the third signal generation circuit 300 may receive an output value from the fourth signal generation circuit 400.

In some embodiments of the inventive concept, because the output value of the first signal generation circuit 100 is input (or applied) to the second signal generation circuit 200 and the output value of the second signal generation circuit 200 is input to the first signal generation circuit 100, the first signal generation circuit 100 and the second signal generation circuit 200 may be understood as a combination of circuits.

Similarly, because the output value of the third signal generation circuit 300 is input to the fourth signal generation circuit 400 and the output value of the fourth signal generation circuit 400 is input to the third signal generation circuit 300, the third signal generation circuit 300 and the fourth signal generation circuit 400 may be understood as a combination of circuits.

With these understandings in mind, two signal generation circuits may cross each other and be combined, such that when the state (or level) of the data input signal D does not change, despite continuous clock signal CK transitions, the respective states of internal transistors associated with the two signal generation circuits may be maintained at fixed levels. Therefore, so long as the level of the data input signal D is fixed (e.g., remains the same), and the level of the output signal Q will remain fixed, and power consumption by the data flip-flop 10 will be greatly reduced.

In this regard, the first signal generation circuit 100 may receive the output signal Q, the clock signal CK, a first internal signal IN1, and the data input signal D and may output a second internal signal IN2. The output signal Q may be the output value of the third signal generation circuit 300 and the first internal signal IN1 may be the output value of the second signal generation circuit 200.

The inverter 500 may receive the first internal signal IN1 and may output an inverted first internal signal IN1N.

The second signal generation circuit 200 may receive the second internal signal IN2, the inverted output signal QN, the clock signal CK, and the inverted first internal signal IN1N and may output the first internal signal IN1. The inverted output signal QN may be the output value of the fourth signal generation circuit 400.

The third signal generation circuit 300 may receive the inverted first internal signal IN1N, the clock signal CK, the second internal signal IN2, and the inverted output signal QN and may output the output signal Q.

The fourth signal generation circuit 400 may receive the output signal Q, the first internal signal IN1, the clock signal CK, and the data input signal D and may output the inverted output signal QN.

In some embodiments, each of the first, second, third and fourth (hereafter collectively, "first to fourth") signal generation circuits 100 to 400 may be implemented by an AND-OR-invert (AOI) gate. The AOI gate may include an AND gate having three inputs and a NOR gate having two inputs.

For example, the first signal generation circuit 100 may include a first AOI gate. The first AOI gate may include a first AND gate 110 receiving the output signal Q, the clock signal CK, and the first internal signal IN1 and a first NOR gate 120 receiving an output of the first AND gate 110 and the data input signal D and generating the second internal signal IN2.

For example, the second signal generation circuit 200 may include a second AOI gate. The second AOI gate may include a second AND gate 210 receiving the inverted output signal QN, the clock signal CK, and the inverted first internal signal IN1N and a second NOR gate 220 receiving an output of the second AND gate 210 and the second internal signal IN2 and generating the first internal signal IN1.

For example, the third signal generation circuit 300 may include a third AOI gate. The third AOI gate may include a third AND gate 310 receiving the inverted first internal signal IN1N, the clock signal CK, and the second internal signal IN2 and a third NOR gate 320 receiving an output of the third AND gate 310 and the inverted output signal QN and generating the output signal Q.

For example, the fourth signal generation circuit 400 may include a fourth AOI gate. The fourth AOI gate may include a fourth AND gate 410 receiving the first internal signal IN1, the clock signal CK, and the data input signal D and a fourth NOR gate 420 receiving an output of the fourth AND gate 410 and the output signal Q and generating the inverted output signal QN.

Figure 3:
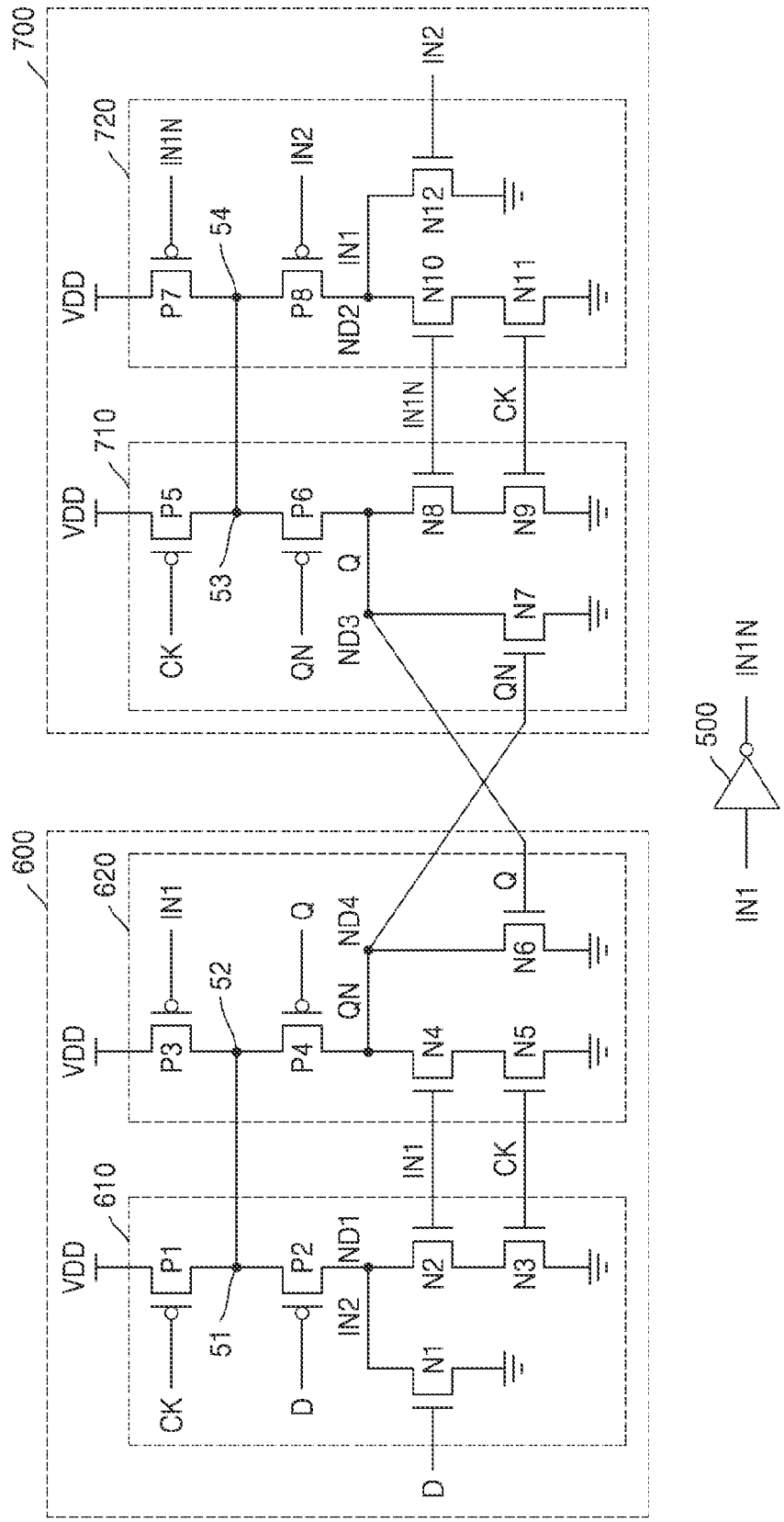
FIG. 3, 4, 8 are respective circuit diagrams further illustrating the data flip-flop of FIG. 1 according to embodiments of the inventive concept.

FIG. 3 is a circuit diagram further illustrating in one example the data flip-flop 10 of FIG. 1. The circuit diagram of FIG. 3 may be an implementation of the logic diagram of FIG. 2.

Referring to FIG. 3, the data flip-flop 10 may include transistor-level first to fourth transistor stacks 610, 620, 710, and 720 and the inverter 500. The first to fourth transistor stacks 610, 620, 710, and 720 may be referred to as signal generation circuits. In some embodiments, the first to fourth transistor stacks 610, 620, 710, and 720 may include P-channel metal-oxide-semiconductor (PMOS) transistors P1 to P8 and N-channel metal-oxide-semiconductor (NMOS) transistors N1 to N12.

The first transistor stack 610 may receive the clock signal CK, the data input signal D, and the first internal signal IN1 and may output the second internal signal IN2 through the first data node ND1.

The second transistor stack 620 may receive the first internal signal IN1, the output signal Q, and the clock signal CK and may output the inverted output signal QN through the fourth data node ND4.

The inverter 500 may receive the first internal signal IN1 and may output the inverted first internal signal IN1N.

The third transistor stack 710 may receive the clock signal CK, the inverted output signal QN, and the inverted first internal signal IN1N and may output the output signal Q through the third data node ND3.

The fourth transistor stack 720 may receive the inverted first internal signal IN1N, the second internal signal IN2, and the clock signal CK and may output the first internal signal IN1 through the second data node ND2.

The first to fourth data nodes ND1 to ND4 of FIG. 3 may respectively correspond to the first to fourth data nodes ND1 to ND4 of FIG. 2.

The second transistor stack 620 may generate the inverted output signal QN through the fourth data node ND4 and the generated inverted output signal QN may be input to the third transistor stack 710. In addition, the third transistor stack 710 may generate the output signal Q through the third data node ND3 and the generated output signal Q may be input to the second transistor stack 620. Therefore, the second transistor stack 620 and the third transistor stack 710 may be connected to each other.

The first transistor stack 610 may include the first PMOS transistor P1 connected between a power voltage line VDD and a first connection node 51, the second PMOS transistor P2 connected between the first connection node 51 and the first data node ND1, the first NMOS transistor N1 connected between the first data node ND1 and a ground line VSS, and the second NMOS transistor N2 and the third NMOS transistor N3 serially connected between the first data node ND1 and the ground line VSS.

The clock signal CK may be input to a gate of the first PMOS transistor P1, the data input signal D may be input to a gate of the second PMOS transistor P2, the data input signal D may be input to a gate of the first NMOS transistor N1, the first internal signal IN1 may be input to a gate of the second NMOS transistor N2, and the clock signal CK may be input to a gate of the third NMOS transistor N3.

The second transistor stack 620 may include the third PMOS transistor P3 connected between the power voltage line VDD and a second connection node 52, the fourth PMOS transistor P4 connected between the second connection node 52 and the fourth data node ND4, the fourth NMOS transistor N4 and an eleventh PMOS transistor serially connected between the fourth data node ND4 and the ground line VSS, and the sixth NMOS transistor N6 connected between the fourth data node ND4 and the ground line VSS.

The first internal signal IN1 may be input to a gate of the third PMOS transistor P3, the output signal Q may be input to a gate of the fourth PMOS transistor P4, the first internal signal IN1 may be input to a gate of the fourth NMOS transistor N4, the clock signal CK may be input to a gate of the fifth NMOS transistor N5, and the output signal Q may be input to a gate of the sixth NMOS transistor N6.

The first connection node 51 of the first transistor stack 610 may be connected to the second connection node 52 of the second transistor stack 620.

The third transistor stack 710 may include the fifth PMOS transistor P5 connected between the power voltage line VDD and a third connection node 53, the sixth PMOS transistor P6 connected between the third connection node 53 and the third data node ND3, the seventh NMOS transistor N7 connected between the third data node ND3 and the ground line VSS, and the eighth NMOS transistor N8 and the ninth NMOS transistor N9 serially connected between the third data node ND3 and the ground line VSS.

The clock signal CK may be input to a gate of the fifth PMOS transistor P5, the inverted output signal QN may be input to a gate of the sixth PMOS transistor P6, the inverted output signal QN may be input to a gate of the seventh NMOS transistor N7, the inverted first internal signal IN1N may be input to a gate of the eighth NMOS transistor N8, and the clock signal CK may be input to a gate of the ninth NMOS transistor N9.

The fourth transistor stack 720 may include the seventh PMOS transistor P7 connected between the power voltage line VDD and a fourth connection node 54, the eighth PMOS transistor P8 connected between the fourth connection node 54 and the second data node ND2, the tenth NMOS transistor N10 and the eleventh NMOS transistor N11 serially connected between the second data node ND2 and the ground line VSS, and the twelfth NMOS transistor N12 connected between the second data node ND2 and the ground line VSS.

The inverted first internal signal IN1N may be input to the gate of the seventh NMOS transistor N7, the second internal signal IN2 may be input to the gate of the eighth PMOS transistor P8, the inverted first internal signal IN1N may be input to the gate of the tenth NMOS transistor N10, the clock signal CK may be input to the gate of the eleventh NMOS transistor N11, and the second internal signal IN2 may be input to the gate of the twelfth NMOS transistor N12.

The third connection node 53 of the third transistor stack 710 may be connected to the fourth connection node 54 of the fourth transistor stack 720.

In the context of the illustrated example of FIG. 3, the data flip-flop 10 may be arranged in a particularly defined semiconductor cell. This semiconductor cell may be arranged in two cell rows, wherein the term "cell row" may refer to between power rails (e.g., a power voltage line VDD and ground line VSS). That is, in some embodiments, a first circuit 600 including the first transistor stack 610 and the second transistor stack 620 may be arranged in a first row, and a second circuit 700 including the third transistor stack 710 and the fourth transistor stack 720 may be arranged in a second row different from the first row.

Figure 4:
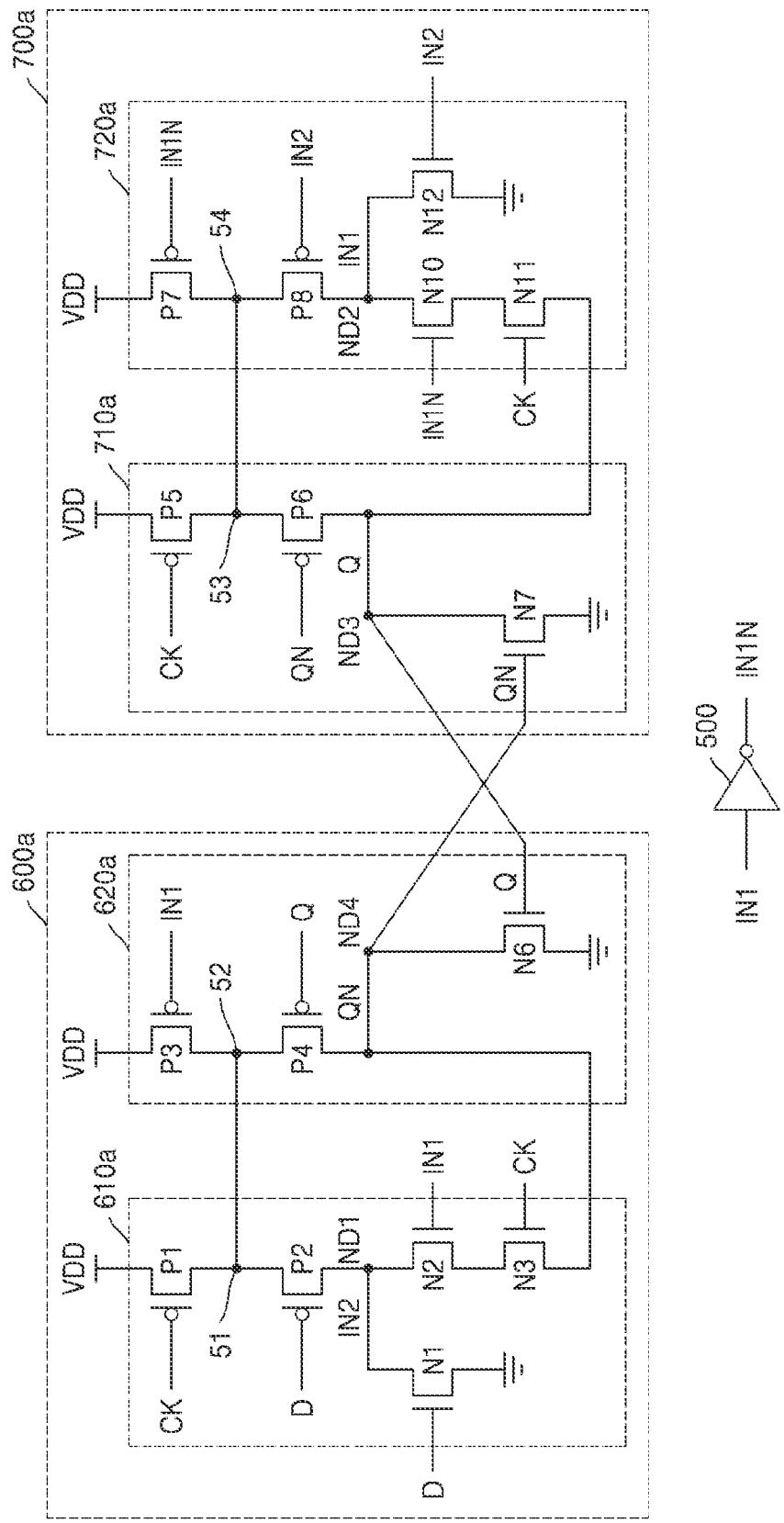

FIG. 4 is a circuit diagram further illustrating in another example the data flip-flop 10 of FIG. 1.

Comparatively referring to FIGS. 3 and 4, the second NMOS transistor N2 and the third NMOS transistor N3 of the first transistor stack 610 may respectively correspond to the fourth NMOS transistor N4 and the fifth NMOS transistor N5 of the second transistor stack 620. Therefore, the fourth NMOS transistor N4 may be merged with the second NMOS transistor N2 and the fifth NMOS transistor N5 may be merged with the third NMOS transistor N3.

The eighth NMOS transistor N8 and the ninth NMOS transistor N9 of the third transistor stack 710 may respectively correspond to the tenth NMOS transistor N10 and the eleventh NMOS transistor N11 of the fourth transistor stack 720. Therefore, the eighth NMOS transistor N8 may be merged with the tenth NMOS transistor N10 and the ninth NMOS transistor N9 may be merged with the eleventh NMOS transistor N11.

As a result, the data flip-flop 10 of FIG. 4 may include first to fourth transistor stacks 610a, 620a, 710a, and 720a.

The third NMOS transistor N3 of the first transistor stack 610a may be connected to the fourth data node ND4 instead of the ground line VSS.

The second transistor stack 620a may not include the fourth NMOS transistor N4 and the fifth NMOS transistor N5. Therefore, the fourth data node ND4 may be connected to a drain of the third NMOS transistor N3 of the first transistor stack 610a.

The third transistor stack 710a may not include the eighth NMOS transistor N8 and the ninth NMOS transistor N9. Therefore, the third data node ND3 may be connected to a drain of the eleventh NMOS transistor N11 of the fourth transistor stack 720a.

The eleventh NMOS transistor N11 of the fourth transistor stack 720a may be connected to the third data node ND3 instead of the ground line VSS.

During a process of designing layouts for the foregoing circuits implementing the data flip-flop 10, in some embodiments, a first circuit 600a including the first transistor stack 610a and the second transistor stack 620a may be arranged in the first row and a second circuit 700a including the third transistor stack 710a and the fourth transistor stack 720a may be arranged in the second row different from the first row.

Figure 5:
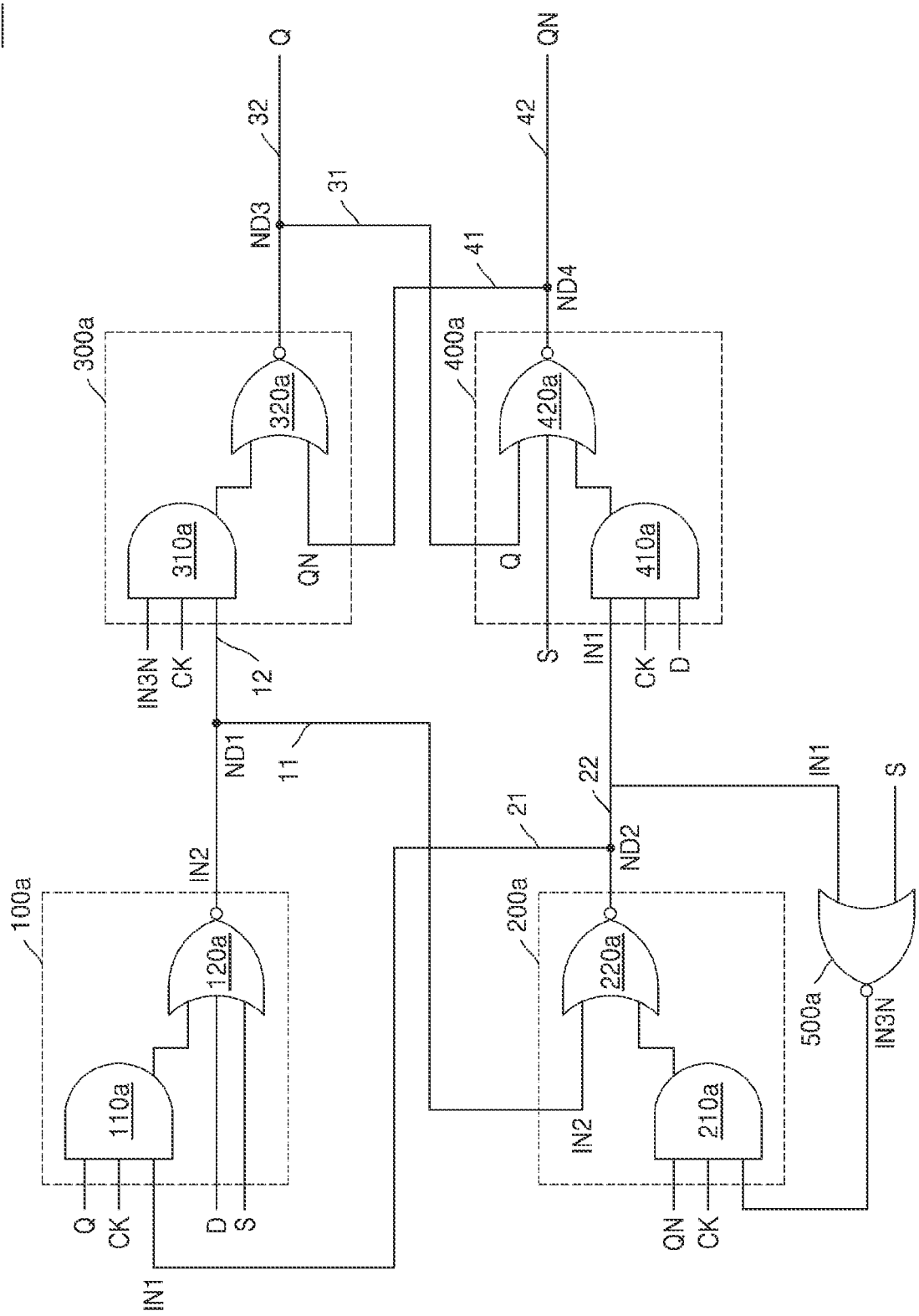

FIG. 5 is a logic diagram illustrating a data flip-flop 10a according to embodiments of the inventive concept.

Referring to FIG. 5, the data flip-flop 10a may include first to fourth signal generation circuits 100a to 400a.

Comparatively referring to FIGS. 2 and 5, the data flip-flop 10a may further include a set signal 'S' line receiving a set signal S. In this regard, the data flip-flop 10a including the set signal S line may be referred to as a "set type flip-flop." When the set signal S is at a logically high level (hereafter, "high"), the data flip-flop 10a may set the output signal Q to be high, regardless of a level of the data input signal D. Thus, the inverted output signal QN will be at a logically low level (hereafter, "low").

The data flip-flop 10a may further include an OR gate and, as an output of the OR gate is input to the inverter (500 of FIG. 2), the OR gate and the inverter 500 may configure a NOR gate 500a together.

The NOR gate 500a may receive the first internal signal IN1 and the set signal S and may output an inverted third internal signal IN3N. For example, the OR gate may receive the first internal signal IN1 and the set signal S and may output a third internal signal IN3 and the inverter 500 may invert the third internal signal IN3 and may output the inverted third internal signal IN3N.

The first signal generation circuit 100a may further receive the set signal S. For example, a first NOR gate 120a of the first signal generation circuit 100a may further receive the set signal S. That is, a first AND gate 110a may correspond to the first AND gate 110.

The second signal generation circuit 200a may receive the inverted third internal signal IN3N instead of the inverted first internal signal IN1N. For example, a second AND gate 210a of the second signal generation circuit 200a may receive the inverted third internal signal IN3N. That is, a second NOR gate 220a may correspond to the second NOR gate 220.

The third signal generation circuit 300a may receive the inverted third internal signal IN3N instead of the inverted first internal signal IN1N. For example, a third AND gate 310a of the third signal generation circuit 300a may receive the inverted third internal signal IN3N. That is, a third NOR gate 320a may correspond to the third NOR gate 320.

The fourth signal generation circuit 400a may further receive the set signal S. For example, a fourth NOR gate 420a of the fourth signal generation circuit 400a may further receive the set signal S. That is, a fourth AND gate 410a may correspond to the fourth AND gate 410.

Figure 6:
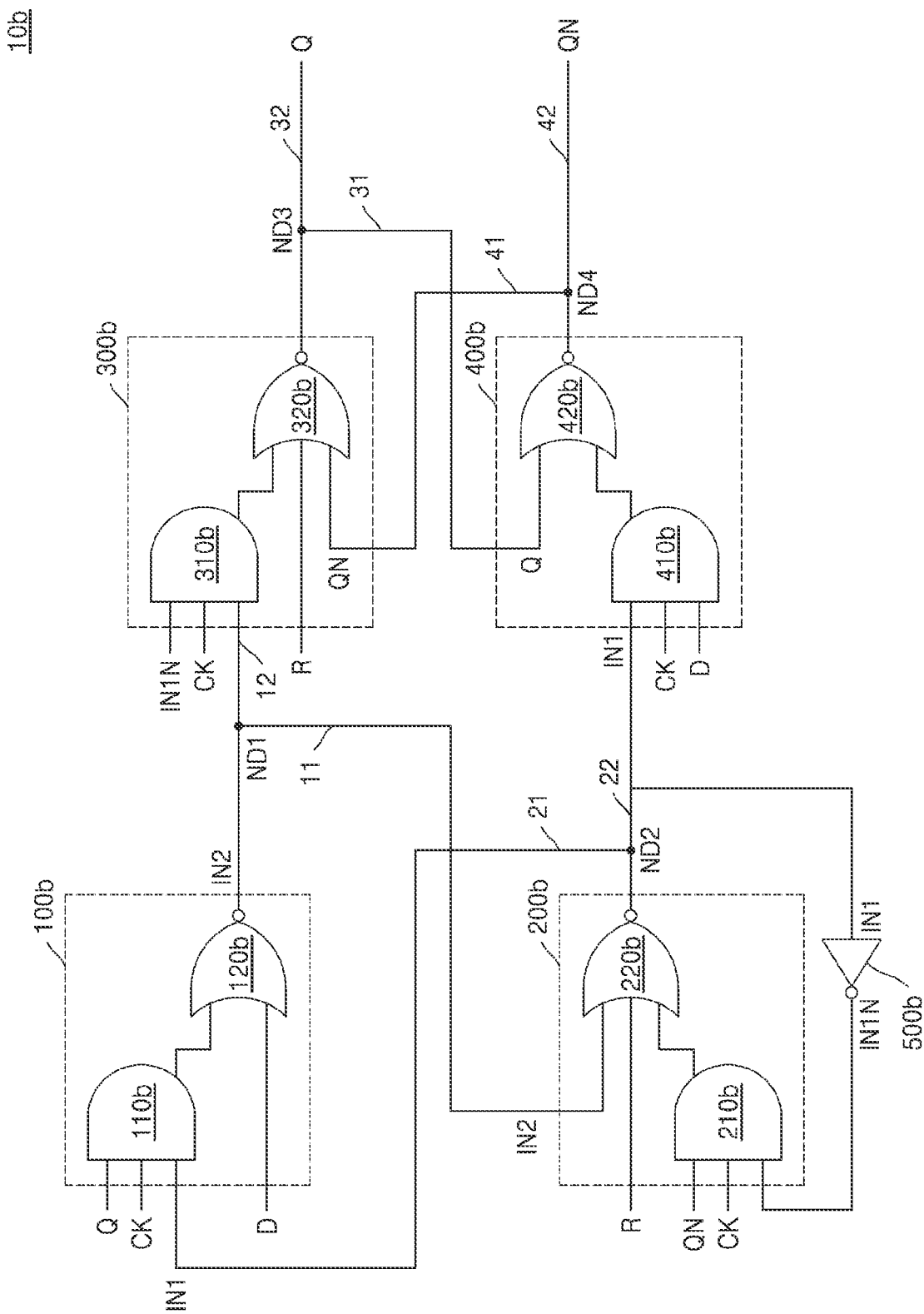

FIG. 6 is a logic diagram illustrating a data flip-flop 10b according to embodiments of the inventive concept.

Referring to FIG. 6, the data flip-flop 10b may include first to fourth signal generation circuits 100b to 400b.

Comparatively referring to FIGS. 2 and 6, the data flip-flop 10b may further include a reset signal R line receiving a reset signal R. The data flip-flop 10b including the reset signal R line may be referred to as a reset type flip-flop. When the reset signal R is high, the data flip-flop 10b may reset the output signal Q to be low, regardless of a level of the data input signal D. Thus, the inverted output signal QN will be high.

The second signal generation circuit 200b may further receive the reset signal R. For example, a second NOR gate 220b of the second signal generation circuit 200b may further receive the reset signal R. That is, a second AND gate 210b may correspond to the second AND gate 210.

The third signal generation circuit 300b may further receive the reset signal R. For example, a third NOR gate 320b of the third signal generation circuit 300b may further receive the reset signal R. That is, a third AND gate 310b may correspond to the third AND gate 310.

The first signal generation circuit 100b including a first AND gate 110b and a first NOR gate 120b may correspond to the first signal generation circuit 100. The fourth signal generation circuit 400b including a fourth AND gate 410b and a fourth NOR gate 420b may correspond to the fourth signal generation circuit 400.

Figure 7:
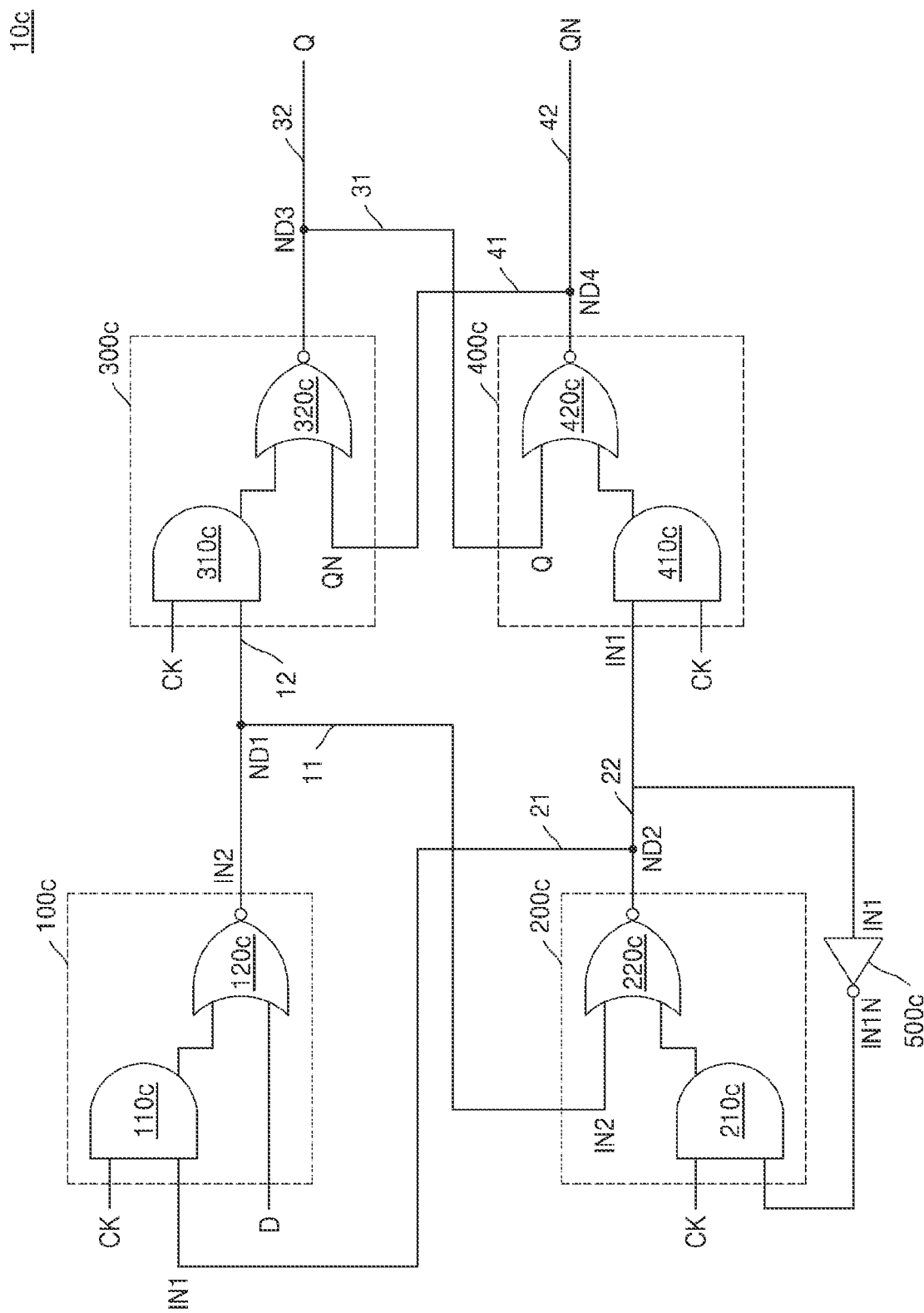

FIG. 7 is a logic diagram illustrating a data flip-flop 10c according to embodiments of the inventive concept.

Comparatively referring to FIGS. 2 and 7, the data flip-flop 10c may include first to fourth signal generation circuits 100c to 400c.

In the data flip-flop 10 of FIG. 2, at least one of the first to fourth AND gates 110 to 410 of the first to fourth signal generation circuits 100 to 400 that may be implemented by the first to fourth AOI gates may have two input values instead of three input values.

In some embodiments, the first AND gate 110 of the first signal generation circuit 100 may have two input values and each of the second to fourth AND gates 210 to 410 may have three input values. In some embodiments, each of the first AND gate 110 of the first signal generation circuit 100 and the third AND gate 310 of the third signal generation circuit 300 may have two input values and each of the second AND gate 210 of the second signal generation circuit 200 and the fourth AND gate 410 of the fourth signal generation circuit 400 may have three input values. However, the scope of the inventive concept is not limited thereto.

In some embodiments implementing the data flip-flop 10c of FIG. 7, each of the first to fourth AND gates 110c to 410c has two input values.

The first signal generation circuit 100c may receive the clock signal CK, the first internal signal IN1, and the data input signal D and may output the second internal signal IN2. For example, the first AND gate 110c of the first signal generation circuit 100c may not receive the output signal Q and may receive only the clock signal CK and the first internal signal IN1. A first NOR gate 120c may correspond to the first NOR gate 120.

The second signal generation circuit 200c may receive the second internal signal IN2, the clock signal CK, and the inverted first internal signal IN1N and may output the first internal signal IN1. For example, the second AND gate 210c of the second signal generation circuit 200c may not receive the inverted output signal QN and may receive only the clock signal CK and the inverted first internal signal IN1N. A second NOR gate 220c may correspond to the second NOR gate 220.

The third signal generation circuit 300c may receive the clock signal CK, the second internal signal IN2, and the inverted output signal QN and may output the output signal Q. For example, the third AND gate 310c of the third signal generation circuit 300c may not receive the inverted first internal signal IN1N and may receive only the clock signal CK and the second internal signal IN2. A third NOR gate 320c may correspond to the third NOR gate 320.

The fourth signal generation circuit 400c may receive the output signal Q, the first internal signal IN1, and the clock signal CK and may output the inverted output signal QN. For example, the fourth AND gate 410c of the fourth signal generation circuit 400c may not receive the data input signal D and may receive only the first internal signal IN1 and the clock signal CK. A fourth NOR gate 420c may correspond to the fourth NOR gate 420.

Figure 8:
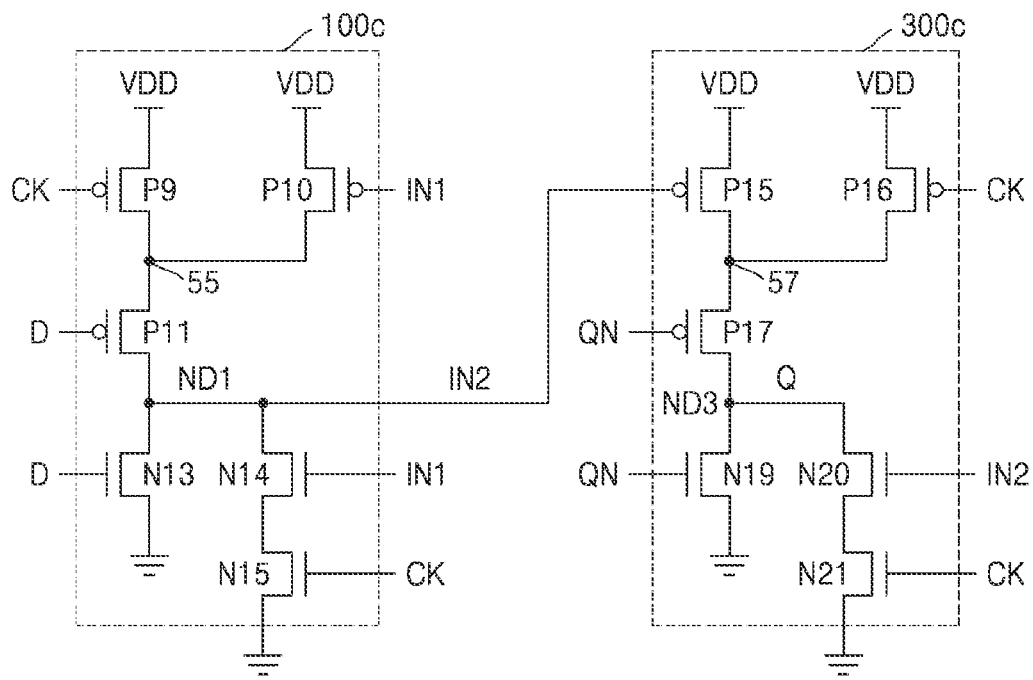
Figure 8:
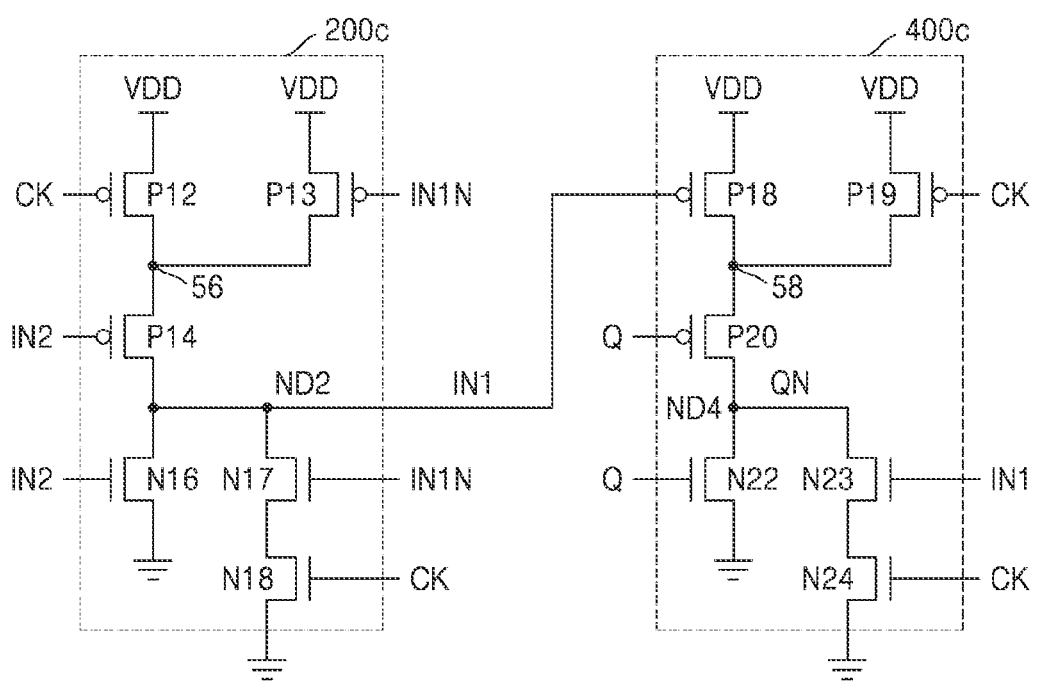
Figure 8:
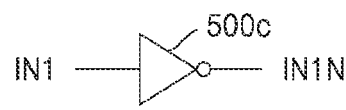

FIG. 8 is a circuit diagram further illustrating a data flip-flop according to embodiments of the inventive concept. Here, the circuit diagram of FIG. 8 may implement the logic diagram of FIG. 7.

Comparatively referring to FIGS. 3 and 8, the first signal generation circuit 100c may include a ninth PMOS transistor P9 connected between the power voltage line VDD and a fifth connection node 55 in parallel, a tenth PMOS transistor P10, an eleventh PMOS transistor P11 connected between the first data node ND1 and the fifth connection node 55, a thirteenth NMOS transistor N13 connected between the first data node ND1 and the ground line VSS, and a fourteenth NMOS transistor N14 and a fifteenth NMOS transistor N15 serially connected between the first data node ND1 and the ground line VSS.

The clock signal CK may be input to a gate of the ninth PMOS transistor P9, the first internal signal IN1 may be input to a gate of the tenth PMOS transistor P10, the data input signal D may be input to a gate of the eleventh PMOS transistor P11, the data input signal D may be input to a gate of the thirteenth NMOS transistor N13, the first internal signal IN1 may be input to a gate of the fourteenth NMOS transistor N14, and the clock signal CK may be input to a gate of the fifteenth NMOS transistor N15.

The second signal generation circuit 200c may include a twelfth PMOS transistor P12 connected between the power voltage line VDD and a sixth connection node 56 in parallel, a thirteenth PMOS transistor P13, a fourteenth PMOS transistor P14 connected between the second data node ND2 and the sixth connection node 56, a sixteenth NMOS transistor N16 connected between the second data node ND2 and the ground line VSS, and a seventeenth NMOS transistor N17 and an eighteenth NMOS transistor N18 serially connected between the second data node ND2 and the ground line VSS.

The clock signal CK may be input to a gate of the twelfth PMOS transistor P12, the inverted first internal signal IN1N may be input to a gate of the thirteenth PMOS transistor P13, the second internal signal IN2 may be input to a gate of the fourteenth PMOS transistor P14, the second internal signal IN2 may be input to a gate of the sixteenth NMOS transistor N16, the inverted first internal signal IN1N may be input to a gate of the seventeenth NMOS transistor N17, and the clock signal CK may be input to a gate of the eighteenth NMOS transistor N18.

The third signal generation circuit 300c may include a fifteenth PMOS transistor P15 connected between the power voltage line VDD and a seventh connection node 57 in parallel, a sixteenth PMOS transistor P16, a seventeenth PMOS transistor P17 connected between the third data node ND3 and the seventh connection node 57, a nineteenth NMOS transistor N19 connected between the third data node ND3 and the ground line VSS, and a twentieth NMOS transistor N20 and a twenty first NMOS transistor N21 serially connected between the third data node ND3 and the ground line VSS.

The second internal signal IN2 may be input to a gate of the fifteenth PMOS transistor P15, the clock signal CK may be input to a gate of the sixteenth PMOS transistor P16, the inverted output signal QN may be input to a gate of the seventeenth PMOS transistor P17, the inverted output signal QN may be input to a gate of the nineteenth NMOS transistor N19, the second internal signal IN2 may be input to a gate of the twentieth NMOS transistor N20, and the clock signal CK may be input to a gate of the twenty first NMOS transistor N21.

The first data node ND1 of the first signal generation circuit 100c may be connected to the gate of the fifteenth PMOS transistor P15 of the third signal generation circuit 300c.

The fourth signal generation circuit 400c may include an eighteenth PMOS transistor P18 connected between the power voltage line VDD and an eighth connection node 58 in parallel, a nineteenth PMOS transistor P19, a twentieth PMOS transistor P20 connected between the fourth data node ND4 and the eighth connection node 58, a twenty second NMOS transistor N22 connected between the fourth data node ND4 and the ground line VSS, and a twenty third NMOS transistor N23 and a twenty fourth NMOS transistor N24 serially connected between the fourth data node ND4 and the ground line VSS.

The first internal signal IN1 may be input to a gate of the eighteenth PMOS transistor P18, the clock signal CK may be input to a gate of the nineteenth PMOS transistor P19, the output signal Q may be input to a gate of the twentieth PMOS transistor P20, the output signal Q may be input to a gate of the twenty second NMOS transistor N22, the first internal signal IN1 may be input to a gate of the twenty third NMOS transistor N23, and the clock signal CK may be input to a gate of the twenty fourth NMOS transistor N24.

The second data node ND2 of the second signal generation circuit 200c may be connected to the gate of the eighteenth PMOS transistor P18 of the fourth signal generation circuit 400c.

Figure 9:
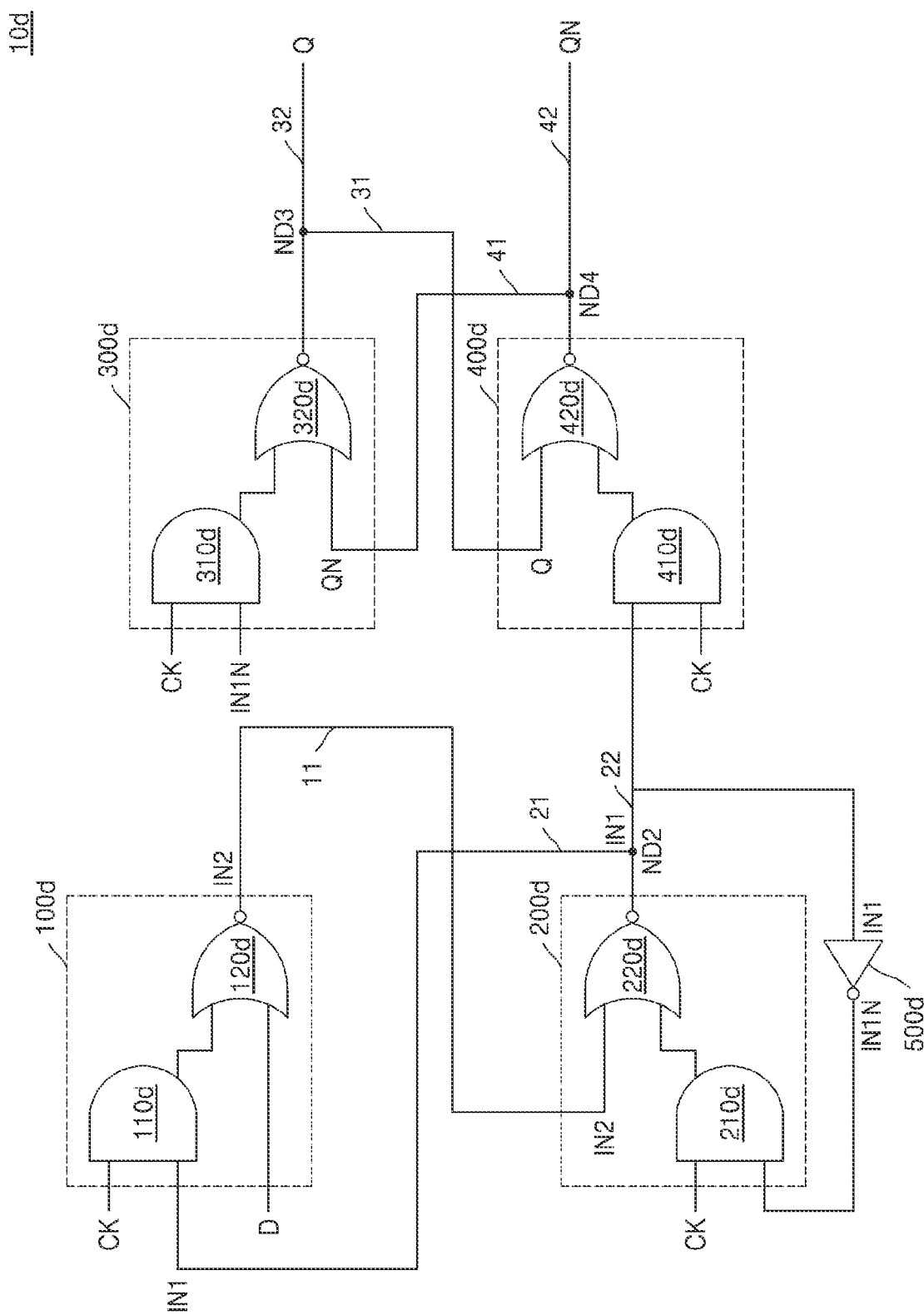

FIG. 9 is a logic diagram illustrating a data flip-flop 10d according to embodiments of the inventive concept.

Comparatively referring to FIGS. 7 and 9, the third signal generation circuit 300d of the data flip-flop 10d of FIG. 9 may receive the inverted first internal signal IN1N, instead of the second internal signal IN2. For example, a third AND gate 310d of the third signal generation circuit 300d may receive the clock signal CK and the inverted first internal signal IN1N.

Therefore, a signal line 11 from which an output value of a first signal generation circuit 100d is output may not be diverged and may be directly input to a second NOR gate 220d of a second signal generation circuit 200d.

As illustrated in FIG. 7, all of the first signal generation circuit 100d, the second signal generation circuit 200d, and the fourth signal generation circuit 400d do not have to include an AND gate having two input values. In some embodiments, at least one of the first signal generation circuit 100d, the second signal generation circuit 200d, and the fourth signal generation circuit 400d may include an AND gate having two input values.

Figure 10A:
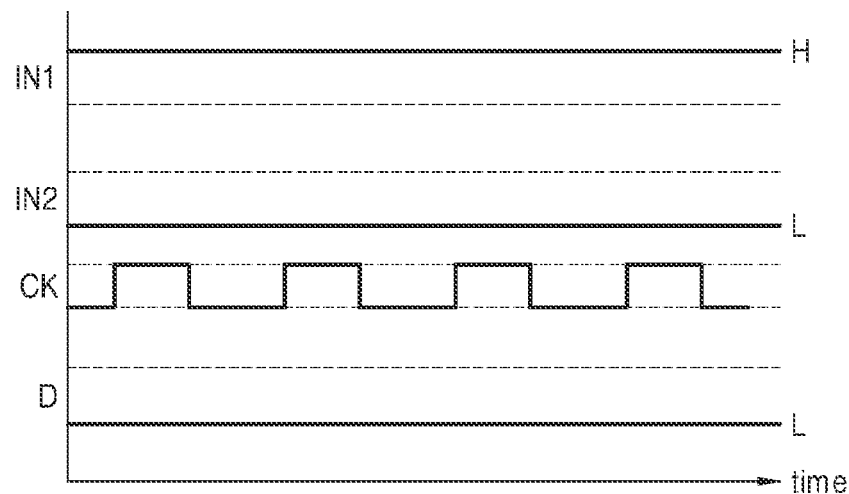
FIGS. 10A and 10B are respective timing diagram further illustrating operation of a data flip-flop according to embodiments of the inventive concept.
Figure 10B:
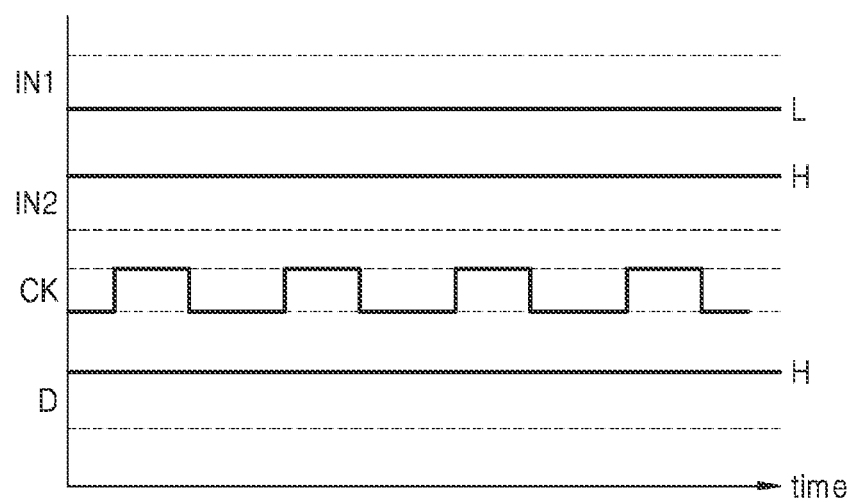

FIGS. 10A and 10B are respective timing diagrams further illustrating operation of a data flip-flop according to embodiments of the inventive concept.

Using the data flip-flop 10 of FIG. 1 as a working example, when the data input signal D is maintained at a fixed level, despite continued transition of the clock signal CK (e.g., as the clock signal toggles over a defined period of time), the first internal signal IN1 and the second internal signal IN2 will not transition, but remain fixed.

Referring to FIG. 10A, when the data input signal D is maintained low, regardless of transitions of the clock signal CK, the first internal signal IN1 is maintained high, and the second internal signal IN2 is maintained low. For example, the output signal Q may be low and the inverted output signal QN may be high.

Referring to FIG. 10B, when the data input signal D is maintained high, regardless of transitions of the clock signal CK, the first internal signal IN1 may be maintained low and the second internal signal IN2 may be maintained high. For example, the output signal Q may be high and the inverted output signal QN may be low.

Accordingly, the data flip-flop 10 according to embodiments of the inventive concept may minimize power consumption during periods in which the data input signal D is fixed.

Figure 11:
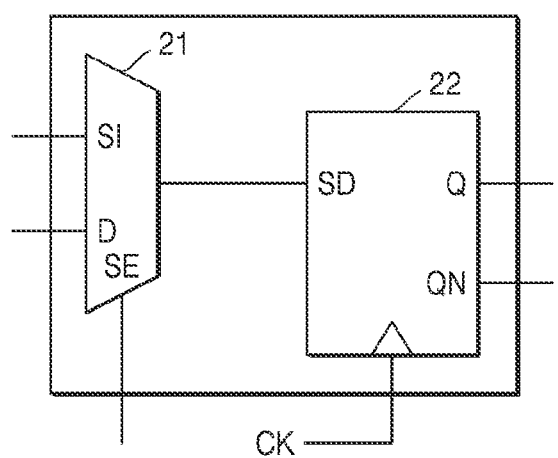
FIG. 11 is a block diagram illustrating a scan flip-flop according to embodiments of the inventive concept.

FIG. 11 is a block diagram illustrating a scan flip-flop 20 according to embodiment of the inventive concept.

Referring to FIG. 11, the scan flip-flop 20 may generally include a multiplexer 21 and a data flip-flop 22. In some embodiments, the data flip-flop 22 may correspond any one the data flip-flops previously described (e.g., data flop-flops 10, 10a, 10b, 10c, and 10d of FIGS. 1, 2, 3, 4, 5, 6, 7, 8, and 9).

Here, however, the multiplexer 21 may select the data input signal D or a scan input signal SI (e.g.,) in response to a high scan enable signal SE, and may output the selected signal to a multiplexer output signal SD.

The scan enable signal SE may indicate a first operating mode or a second operating mode for the scan flip-flop 20. For example, when the scan enable signal SE has a first logic level (e.g., low), the scan enable signal SE may indicate the first operating mode and, when the scan enable signal SE has a second logic level (e.g., high), the scan enable signal SE may indicate the second operating mode.

In some embodiments, the first operating mode may be a normal operating mode during which data transmission may be performed, and the second operating mode may be a scan test mode during which test routine(s) may be performed. However, the inventive concept is not limited thereto.

Thus, assuming the scan enable signal SE indicates the normal operating mode, the scan flip-flop 20 may output the output signal Q and the inverted output signal QN based on the data input signal D. For example, the scan flip-flop 20 may perform a normal operation of providing the output signal Q and the inverted output signal QN by latching the data input signal D.

However, assuming the scan enable signal SE indicates the scan test mode, the scan flip-flop 20 may output the output signal Q and the inverted output signal QN based on the scan input signal SI. For example, the scan flip-flop 20 may perform a scan operation of latching the scan input signal SI.

When the multiplexer 21 selects the data input signal D, the polarity of the multiplexer output signal SD may be opposite to or the same as the data input signal D. In some of the embodiments that follow, it is assumed that the polarity of the multiplexer output signal SD is opposite to that of the data input signal D, but this is just a working assumption.

Figure 12:
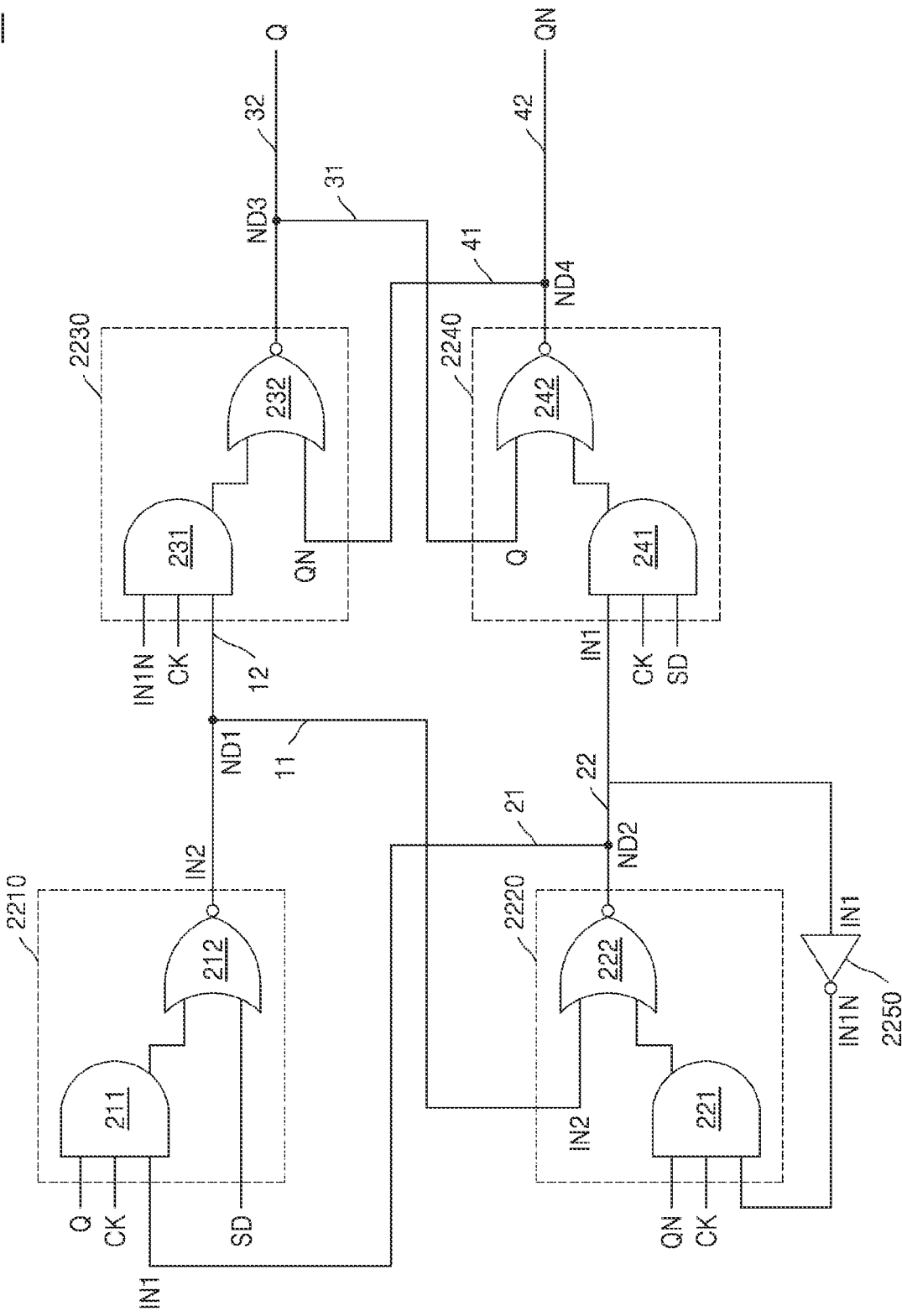
FIG. 12 is a logic diagram further illustrating the data flip-flip 22 in the scan flip-flop of FIG. 11 according to embodiments of the inventive concept.

FIG. 12 is a logic diagram further illustrating the data flip-flop 22 of FIG. 11 according to embodiments of the inventive concept. Here, the data flip-flop 22 may correspond any one of the data flip-flops (10, 10a, 10b, 10c, and 10d of FIGS. 1, 2, 3, 4, 5, 6, 7, 8 and 9).

Comparatively referring to FIGS. 2 and 12, the data flip-flop 22 may include fifth to eighth signal generation circuits 2210 to 2240 and an inverter 2250.

The fifth signal generation circuit 2210 may include a fifth AOI gate including a fifth AND gate 211 and a fifth NOR gate 212, the sixth signal generation circuit 2220 may include a sixth AOI gate including a sixth AND gate 221 and a sixth NOR gate 222, the seventh signal generation circuit 2230 may include a seventh AOI gate including a seventh AND gate 231 and a seventh NOR gate 232, and the eighth signal generation circuit 2240 may include an eighth AOI gate including an eighth AND gate 241 and an eighth NOR gate 242.

The fifth to eighth signal generation circuits 2210 to 2240 may respectively correspond to the first to fourth signal generation circuits 100 to 400 of FIG. 2. In addition, the inverter 2250 may correspond to the inverter 500 of FIG. 2.

However, unlike the first signal generation circuit 100 of FIG. 2, the fifth signal generation circuit 2210 may receive the multiplexer output signal SD instead of the data input signal D. For example, the fifth NOR gate 212 may receive the multiplexer output signal SD. Further, unlike the fourth signal generation circuit 400 of FIG. 2, the eighth signal generation circuit 2240 may receive the multiplexer output signal SD instead of the data input signal data D. For example, the eighth AND gate 241 may receive the multiplexer output signal SD.

When the polarity of the multiplexer output signal SD is opposite to that of the data input signal D in the normal operating mode, polarity of the output signal Q may be opposite to that of the data input signal D.

Figure 13:
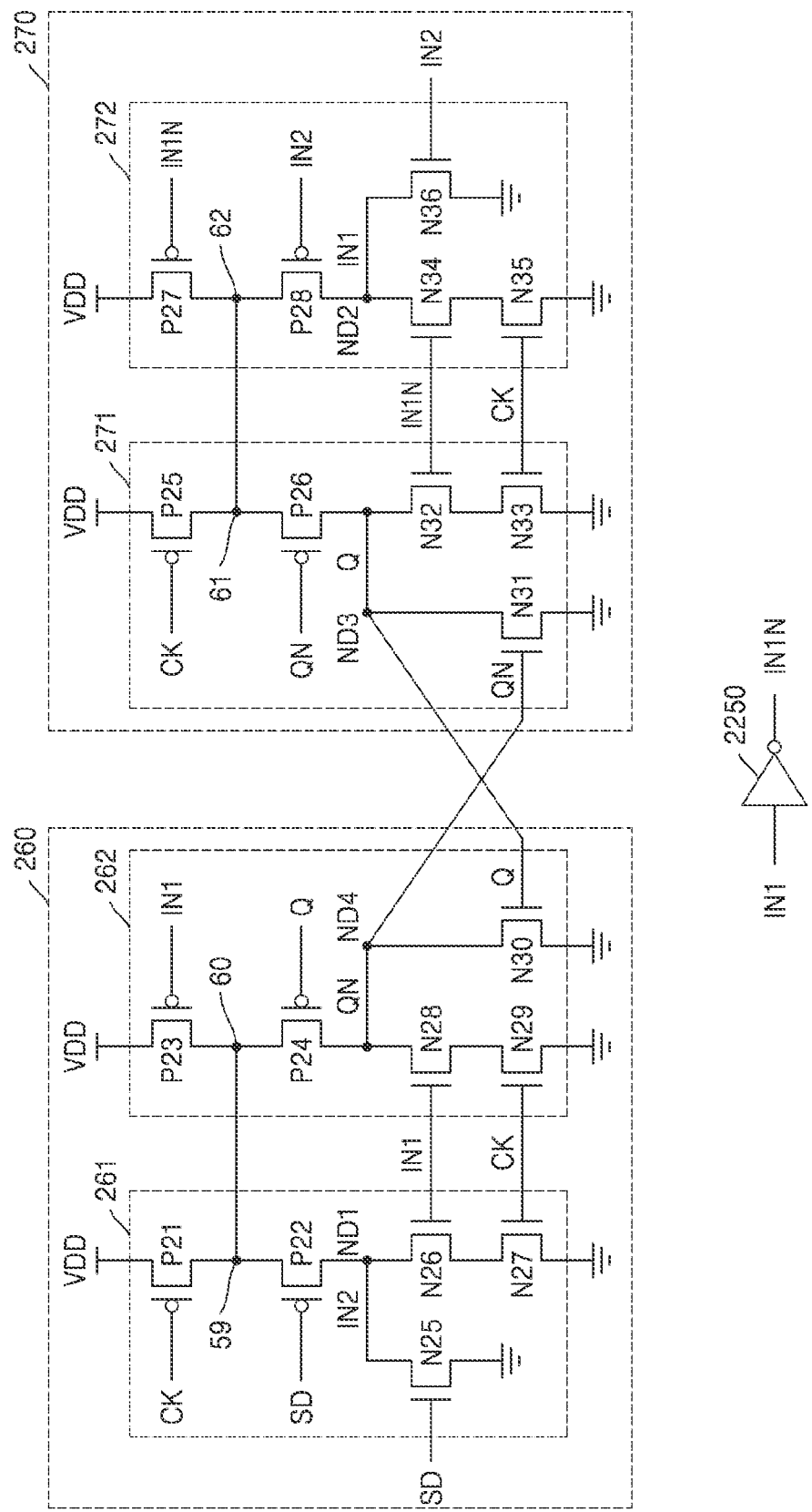
FIGS. 13 and 15 are respective circuit diagrams further illustrating the data flip-flop 22 in the scan flip-flop of FIG. 11 according to embodiments of the inventive concept.

FIG. 13 is a circuit diagram further illustrating the data flip-flop 22 of FIG. 11 according to embodiments of the inventive concept. Here, the circuit diagram of FIG. 13 may implement the logic diagram of FIG. 12. In addition, the data flip-flop 22 of FIG. 13 may correspond to the data flip-flop 10 of FIG. 3.

Comparatively referring to FIGS. 3 and 13, the data flip-flop 22 may include transistor-level fifth to eighth transistor stacks 261, 262, 271, and 272 and an inverter 2250. The fifth to eighth transistor stacks 261, 262, 271, and 272 may be referred to as signal generation circuits.

The fifth to eighth transistor stacks 261, 262, 271, and 272 may respectively correspond to the first to fourth transistor stacks 610, 620, 710, and 720 of FIG. 3. In addition, the inverter 2250 may correspond to the inverter 500 of FIG. 3.

The fifth transistor stack 261 may include a twenty first PMOS transistor P21, a twenty second PMOS transistor P22, and twenty fifth to twenty seventh NMOS transistors N25 to N27. Unlike the first transistor stack 610, the multiplexer output signal SD may be input to each of a gate of the twenty second PMOS transistor P22 and a gate of the twenty fifth NMOS transistor N25 of the fifth transistor stack 261.

The sixth transistor stack 262 may include a twenty third PMOS transistor P23, a twenty fourth PMOS transistor P24, and twenty eighth to thirtieth NMOS transistors N28 to N30.

A ninth connection node 59 of the fifth transistor stack 261 may be connected to a tenth connection node 60 of the sixth transistor stack 262.

The seventh transistor stack 271 may include a twenty fifth PMOS transistor P25, a twenty sixth PMOS transistor P26, and thirty first to thirty third NMOS transistors N31 to N33.

The eighth transistor stack 272 may include a twenty seventh PMOS transistor P27, a twenty eighth PMOS transistor P28, and thirty fourth to thirty sixth NMOS transistors N34 to N36.

An eleventh connection node 61 of the seventh transistor stack 271 may be connected to a twelfth connection node 62 of the eighth transistor stack 272.

In a process of designing layouts of the circuits of the data flip-flop 22 according to the above-described embodiment, in an embodiment, a third circuit 260 including the fifth transistor stack 261 and the sixth transistor stack 262 may be arranged in a first row and a fourth circuit 270 including the seventh transistor stack 271 and the eighth transistor stack 272 may be arranged in a second row different from the first row.

Figure 14:
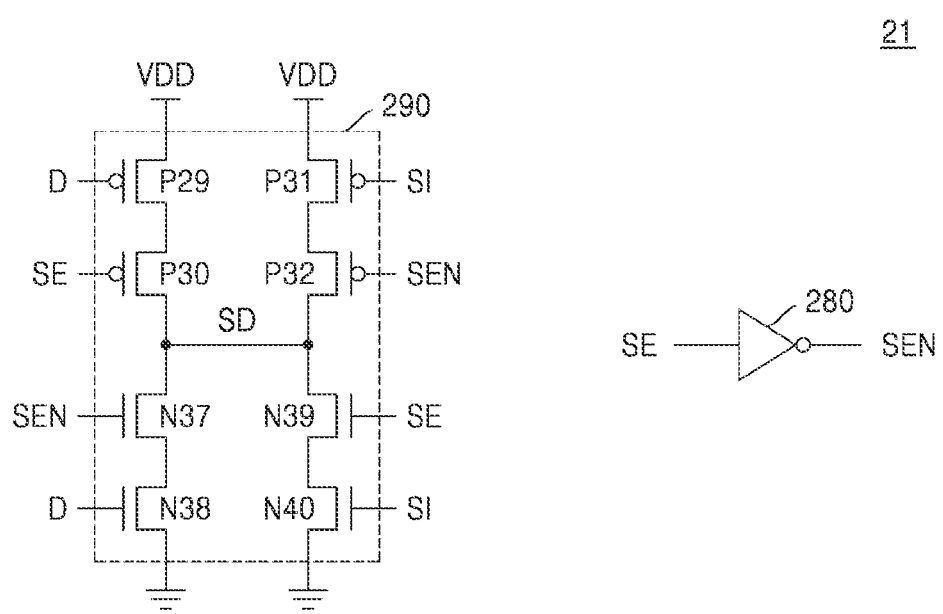
FIG. 14 is a circuit diagram further illustrating the multiplexer 21 in the scan flip-flop of FIG. 11 according to embodiments of the inventive concept.

FIG. 14 is a circuit diagram illustrating the multiplexer 21 of FIG. 11 according to embodiments of the inventive concept.

Referring to FIG. 14, the multiplexer 21 may include twenty ninth to thirty second PMOS transistors P29 to P32, thirty seventh to fortieth NMOS transistors N37 to N40, and an inverter 280.

The inverter 280 may receive the scan enable signal SE and may output an inverted scan enable signal SEN.

The twenty ninth PMOS transistor P29, the thirtieth PMOS transistor P30, the thirty seventh NMOS transistor N37, and the thirty eighth NMOS transistor N38 may be serially connected between the power voltage line VDD and the ground line VSS.

The thirty first PMOS transistor P31, the thirty second PMOS transistor P32, the thirty ninth NMOS transistor N39, and the fortieth NMOS transistor N40 may be serially connected between the power voltage line VDD and the ground line VSS.

The data input signal D may be input to a gate of the twenty ninth PMOS transistor P29, the scan enable signal SE may be input to a gate of the thirtieth PMOS transistor P30, the scan input signal SI may be input to a gate of the thirty first PMOS transistor P31, and the inverted scan enable signal SEN may be input to a gate of the thirty second PMOS transistor P32.

The inverted scan enable signal SEN may be input to a gate of the thirty seventh NMOS transistor N37, the data input signal D may be input to a gate of the thirty eighth NMOS transistor N38, the scan enable signal SE may be input to a gate of the thirty ninth NMOS transistor N39, and the scan input signal SI may be input to a gate of the fortieth NMOS transistor N40.

A connection node between the thirtieth PMOS transistor P30 and the thirty seventh NMOS transistor N37 may be connected to a connection node between the thirty second PMOS transistor P32 and the thirty ninth NMOS transistor N39. Through the connection node, the multiplexer output signal SD may be output. For example, the multiplexer output signal SD may be obtained by inverting the data input signal D.

Figure 15:
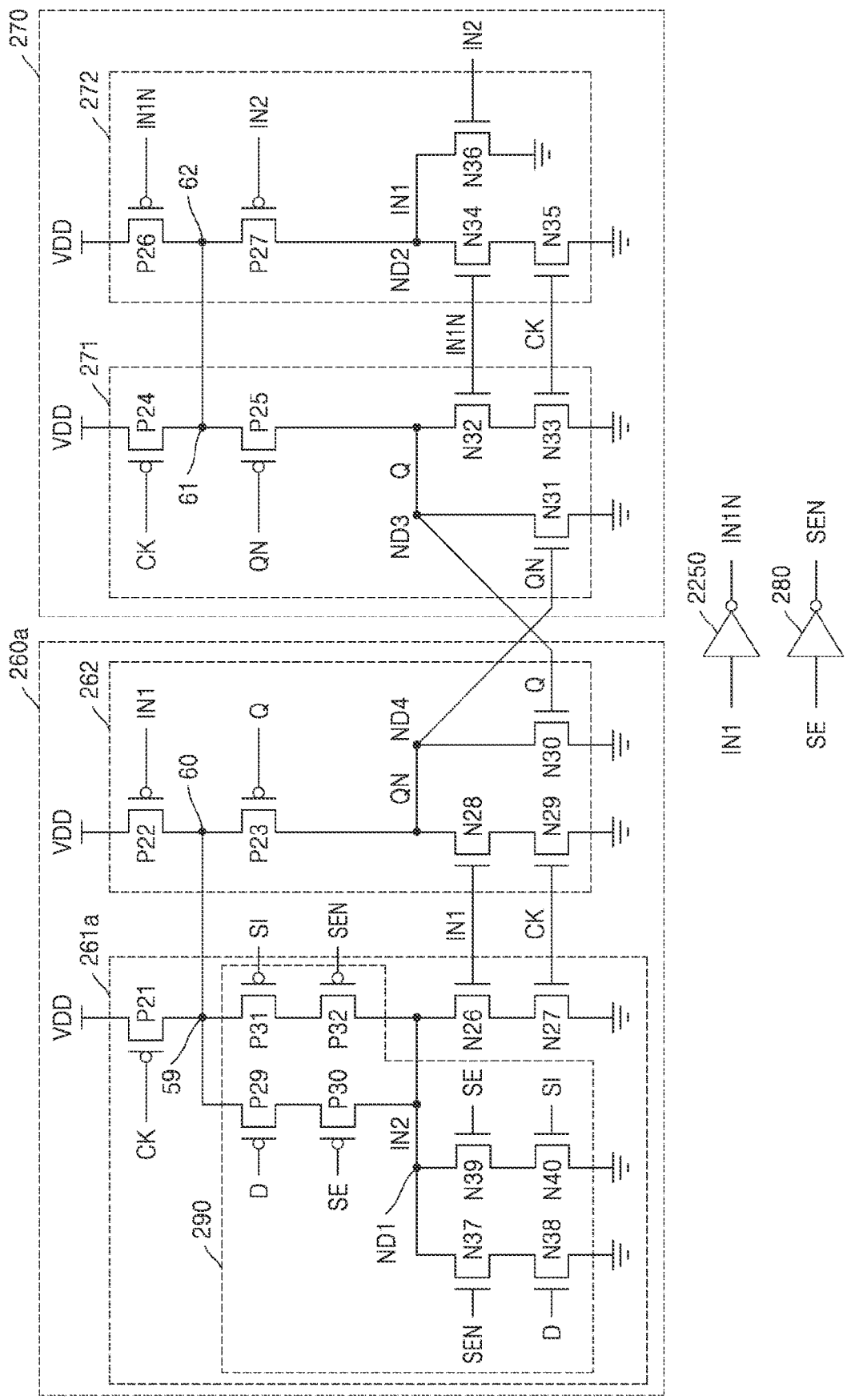

FIG. 15 is a circuit diagram further illustrating the scan flip-flop 20 of FIG. 11 according to embodiments of the inventive concept.

Comparatively referring to FIGS. 13, 14 and 15, a circuit 290 corresponding to the multiplexer (e.g., element 21 of FIG. 14) may be implemented as a data flip-flop circuit. Thus, the embodiment of FIG. 15 may obtained by essentially merging the circuits of FIGS. 13 and 14.

The scan flip-flop 20 may include fifth to eighth transistor stacks 261a, 262, 271, and 272 and two inverters 2250 and 280.

The fifth transistor stack 261a may include the twenty first PMOS transistor P21 connected between the power voltage line VDD and the ninth connection node 59.

In addition, the fifth transistor stack 261a may include the twenty ninth PMOS transistor P29 and the thirtieth PMOS transistor P30 serially connected between the ninth connection node 59 and the first data node ND1 and the thirty first PMOS transistor P31 and the thirty second PMOS transistor P32 serially connected between the ninth connection node 59 and the first data node ND1 instead of the twenty second PMOS transistor P22.

In addition, the fifth transistor stack 261a may include the thirty seventh NMOS transistor N37 and the thirty eighth NMOS transistor N38 serially connected between the first data node ND1 and the ground line VSS and the thirty ninth NMOS transistor N39 and the fortieth NMOS transistor N40 serially connected between the first data node ND1 and the ground line VSS instead of the twenty fifth NMOS transistor N25.

In addition, the fifth transistor stack 261a may include the twenty sixth NMOS transistor N26 and the twenty seventh NMOS transistor N27 serially connected between the first data node ND1 and the ground line VSS.

During a process of designing layouts for the circuits of the scan flip-flop 20 according to the above-described embodiment, in some embodiments, a third circuit 260a including the fifth transistor stack 261a and the sixth transistor stack 262 may be arranged in a first row and a fourth circuit 270 including the seventh transistor stack 271 and the eighth transistor stack 272 may be arranged in a second row different from the first row.

Because the fourth circuit 270 may correspond to the second circuit 700 of FIG. 3, the fourth circuit 270 may be implemented by a circuit diagram of the second circuit 700a of FIG. 4.

While the inventive concept has been particularly shown and described with reference to embodiments thereof, it will be understood that various changes in form and details may be made therein without departing from the spirit and scope of the following claims.

What is claimed is:

1. A flip-flop that receives a data input signal and generates an output signal and an inverted output signal in response to a clock signal, the flip-flop comprising:
a first signal generation circuit, a second signal generation circuit, a third signal generation circuit, a fourth signal generation circuit, and an inverter,
wherein the first signal generation circuit receives the clock signal, the data input signal, and a first internal signal, and generates a second internal signal,
the inverter receives the first internal signal and generates an inverted first internal signal,
the second signal generation circuit receives the first internal signal and an output signal from the third signal generation circuit and generates the inverted output signal,
the third signal generation circuit receives the clock signal and the inverted output signal and generates the output signal from the third signal generation circuit, and
the fourth signal generation circuit receives the inverted first internal signal, the second internal signal, and the clock signal and generates the first internal signal.

2. The flip-flop of claim 1, wherein the first signal generation circuit comprises:
a first P-channel metal-oxide-semiconductor (PMOS) transistor and a second PMOS transistor serially connected between a first data node providing the second internal signal and a power voltage line;
a first N-channel metal-oxide-semiconductor (NMOS) transistor connected between the first data node and a ground line; and
a second NMOS transistor and a third NMOS transistor serially connected between a second data node providing the inverted output signal and the first data node,
wherein the clock signal is input to a gate of the first PMOS transistor,
the data input signal is input to a gate of the second PMOS transistor,
the data input signal is input to a gate of the first NMOS transistor,
the first internal signal is input to a gate of the second NMOS transistor, and
the clock signal is input to a gate of the third NMOS transistor.

3. The flip-flop of claim 2, wherein the second signal generation circuit comprises:
a third PMOS transistor and a fourth PMOS transistor serially connected between the second data node and the power voltage line; and
a fourth NMOS transistor connected between the second data node and the ground line,
wherein a connection node between the first PMOS transistor and the second PMOS transistor is connected to a connection node between the third PMOS transistor and the fourth PMOS transistor,
the first internal signal is input to a gate of the third PMOS transistor,
the output signal is input to a gate of the fourth PMOS transistor, and
the output signal is connected to a gate of the fourth NMOS transistor.

4. The flip-flop of claim 3, wherein the third signal generation circuit comprises:
a fifth PMOS transistor and a sixth PMOS transistor serially connected between a third data node providing the first internal signal and the power voltage line;
a fifth NMOS transistor connected between the third data node and the ground line; and
a sixth NMOS transistor and a seventh NMOS transistor serially connected between a fourth data node providing the output signal and the third data node,
wherein the inverted first internal signal is input to a gate of the fifth PMOS transistor,
the second internal signal is input to a gate of the sixth PMOS transistor,
the second internal signal is input to a gate of the fifth NMOS transistor,
the inverted first internal signal is input to a gate of the sixth NMOS transistor, and
the clock signal is input to a gate of the seventh NMOS transistor.

5. The flip-flop of claim 4, wherein the fourth signal generation circuit comprises:
a seventh PMOS transistor and an eighth PMOS transistor serially connected between the fourth data node and the power voltage line; and an eighth NMOS transistor connected between the fourth data node and the ground line,
wherein a connection node between the fifth PMOS transistor and the sixth PMOS transistor is connected to a connection node between the seventh PMOS transistor and the eighth PMOS transistor,
the clock signal is input to a gate of the seventh PMOS transistor,
the inverted output signal is input to a gate of the eighth PMOS transistor, and
the inverted output signal is input to a gate of the eighth NMOS transistor.

6. The flip-flop of claim 1, wherein the first signal generation circuit and the second signal generation circuit are arranged in a first row, and
the third signal generation circuit and the fourth signal generation circuit are arranged in a second row different from the first row.

7. The flip-flop of claim 1, wherein the first signal generation circuit comprises:
a first P-channel metal-oxide-semiconductor (PMOS) transistor and a second PMOS transistor serially connected between a first data node providing the second internal signal and a power voltage line;
a first N-channel metal-oxide-semiconductor (NMOS) transistor connected between the first data node and a ground line; and
a second NMOS transistor and a third NMOS transistor serially connected between the first data node and the ground line,
wherein the clock signal is input to a gate of the first PMOS transistor,
the data input signal is input to a gate of the second PMOS transistor,
the data input signal is input to a gate of the first NMOS transistor,
the first internal signal is input to a gate of the second NMOS transistor, and
the clock signal is input to a gate of the third NMOS transistor; and
the second signal generation circuit comprises:
a third PMOS transistor and a fourth PMOS transistor serially connected between the second data node and the power voltage line;
a fourth NMOS transistor connected between the second data node and the ground line; and
a fifth NMOS transistor and a sixth NMOS transistor serially connected between the second data node and the ground line,
wherein a connection node between the first PMOS transistor and the second PMOS transistor is connected to a connection node between the third PMOS transistor and the fourth PMOS transistor,
the first internal signal is input to a gate of the third PMOS transistor,
the output signal is input to a gate of the fourth PMOS transistor,
the output signal is connected to a gate of the fourth NMOS transistor,
the first internal signal is input to a gate of the fifth NMOS transistor, and
the clock signal is input to a gate of the sixth NMOS transistor.

8. The flip-flop of claim 7, wherein the flip-flop further comprises:
a multiplexer that receives the data input signal and a scan input signal,
wherein the multiplexer is configured to select one of the data input signal or the scan input signal in response to a scan enable signal as a multiplexer output signal, and provide the multiplexer output signal to a line providing the data input signal, such that when operating in a normal mode, the flip-flop generates the output signal and the inverted output signal in response to the data input signal, and when operating in a scan test mode, the flip-flop generates the output signal and the inverted output signal in response to the scan input signal.

9. The flip-flop of claim 8, wherein the first signal generation circuit further comprises:
a fifth PMOS transistor and a sixth PMOS transistor serially connected between a drain of the first PMOS transistor and the first data node;
a seventh PMOS transistor connected between a drain of the second PMOS transistor and the first data node;
a seventh NMOS transistor connected between the first data node and a source of the first NMOS transistor; and
an eighth NMOS transistor and a ninth NMOS transistor serially connected between the first data node and the ground line,
wherein the scan input signal is input to a gate of the fifth PMOS transistor,
an inverted scan enable signal is input to a gate of the sixth PMOS transistor,
the scan enable signal is input to a gate of the seventh PMOS transistor,
the inverted scan enable signal is input to a gate of the seventh NMOS transistor,
the scan enable signal is input to a gate of the eighth NMOS transistor, and
the scan input signal is input to a gate of the ninth NMOS transistor.

10. A flip-flop that receives a data input signal and generates an output signal and an inverted output signal in response to a clock signal, the flip-flop comprising:
a first signal generation circuit, a second signal generation circuit, a third signal generation circuit, a fourth signal generation circuit, and an inverter,
wherein the first signal generation circuit receives an output signal from the third signal generation circuit, the clock signal, the data input signal, and a first internal signal, and generates a second internal signal,
the inverter receives the first internal signal and generates an inverted first internal signal,
the second signal generation circuit receives the second internal signal, the clock signal, the inverted first internal signal, and an inverted output signal and generates the first internal signal,
the third signal generation circuit receives the inverted first internal signal, the clock signal, the second internal signal, and the inverted output signal and generates the output signal from the third signal generation circuit, and
the fourth signal generation circuit receives the output signal, the first internal signal, the clock signal, and the data input signal and generates the inverted output signal.

11. The flip-flop of claim 10, wherein the first signal generation circuit includes a first AND-OR-invert (AOI) gate comprising:
a first AND gate that receives the output signal, the clock signal, and the first internal signal and generates a first AND gate output; and a first NOR gate that receives the first AND gate output and the data input signal and generates the second internal signal.

12. The flip-flop of claim 11, wherein the second signal generation circuit includes a second AOI gate comprising:
a second AND gate that receives the inverted output signal, the clock signal, and the inverted first internal signal and generates a second AND gate output; and
a second NOR gate that receives the second AND gate output and the second internal signal and generates the first internal signal.

13. The flip-flop of claim 12, wherein the third signal generation circuit includes a third AOI gate comprising:
a third AND gate that receives the inverted first internal signal, the clock signal, and the second internal signal and generates a third AND gate output; and
a third NOR gate that receives the third AND gate output and the inverted output signal and generates the output signal.

14. The flip-flop of claim 13, wherein the fourth signal generation circuit includes a fourth AOI gate comprising:
a fourth AND gate that receives the first internal signal, the clock signal, and the data input signal and generates a fourth AND gate output; and
a fourth NOR gate that receives the fourth AND gate output and the output signal and generates the inverted output signal.

15. The flip-flop of claim 10, wherein the second signal generation circuit further receives a reset signal,
the third signal generation circuit further receives the reset signal, and
the flip-flop generates a low output signal in response to the reset signal.

16. A flip-flop that receives a data input signal and generates an output signal and an inverted output signal in response to a clock signal, the flip-flop comprising:
a first signal generation circuit, a second signal generation circuit, a third signal generation circuit, a fourth signal generation circuit and an inverter,
wherein the first signal generation circuit receives the clock signal, a first internal signal and the data input signal and generates a second internal signal,
the inverter receives the first internal signal and generates an inverted first internal signal,
the second signal generation circuit receives the second internal signal, the clock signal, and the inverted first internal signal and generates the first internal signal,
the third signal generation circuit receives the clock signal, the second internal signal, and an inverted output signal and generates the output signal, and
the fourth signal generation circuit receives the output signal, the first internal signal, and the clock signal and generates the inverted output signal.

17. The flip-flop of claim 16, wherein the first signal generation circuit includes a first AND-OR-invert (AOI) gate, comprising:
an AND gate that receives the clock signal and the first internal signal and generates an AND gate output; and
a NOR gate that receives the AND gate output and the data input signal and generates the second internal signal.

18. The flip-flop of claim 17, wherein the first AND gate further receives the output signal.

19. The flip-flop of claim 16, wherein the second signal generation circuit comprises a second AOI gate, comprising:
an AND gate that receives the clock signal and the inverted first internal signal and generate a second AND gate output; and
a NOR gate that receives the second AND gate output and the second internal signal and generates the first internal signal.

20. The flip-flop of claim 19, wherein the second AND gate further receives the inverted output signal.

* * * * *